(12) United States Patent
Cho

(10) Patent No.: US 6,943,711 B2
(45) Date of Patent: Sep. 13, 2005

(54) FREQUENCY-DIGITAL SIGNAL CONVERSION CIRCUIT

(75) Inventor: Sang-Jun Cho, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 41 days.

(21) Appl. No.: 10/740,316

(22) Filed: Dec. 17, 2003

(65) Prior Publication Data

US 2004/0217894 A1 Nov. 4, 2004

(30) Foreign Application Priority Data

Apr. 30, 2003 (KR) ................................ 10-2003-0027524

(51) Int. Cl.[7] .............................................. H03M 1/48
(52) U.S. Cl. ...................................................... 341/116
(58) Field of Search ................................ 341/116, 115, 341/131, 139

(56) References Cited

U.S. PATENT DOCUMENTS 3,912,869 A * 10/1975 Ullakko ........................ 341/54
4,009,402 A * 2/1977 Miller ......................... 327/174
4,025,868 A * 5/1977 Miki et al. ................ 324/76.39
4,107,600 A * 8/1978 McMannis ................ 324/76.63
5,369,404 A * 11/1994 Galton ........................ 341/143
6,370,555 B1 * 4/2002 Bartkowiak ................. 708/311

* cited by examiner

*Primary Examiner*—Peguy JeanPierre
(74) *Attorney, Agent, or Firm*—Blakely Sokoloff Taylor & Zafman (57) ABSTRACT

There is provided a frequency-digital signal conversion circuit for automatically converting a clock frequency into a digital signal. The frequency-digital signal conversion circuit includes: a frequency detecting unit for detecting a frequency of an input clock signal; a latch unit for sampling and latching an output of the frequency detecting unit; and a digital signal generating unit for receiving an output of the latch unit and generating a digital signal of a predetermined bits with respect to the frequency of the input clock signal.

8 Claims, 7 Drawing Sheets

FREQUENCY-DIGITAL SIGNAL CONVERSION CIRCUIT

FIELD OF THE INVENTION

The present invention relates to a frequency-digital signal conversion circuit; and, more particularly, to a frequency-digital signal conversion circuit which is capable of operating at various input frequencies by automatically converting input frequencies into digital signals.

DESCRIPTION OF THE PRIOR ART

There is a demand for a circuit which can determine the most suitable operating state in an operating frequency range of a system clock by controlling an overall circuit through a conversion of the operating frequency into the digital signals. Generally, a phase-frequency detector is used as the circuit. The phase-frequency detector determines the cases that the frequency of the input clock with respect to the reference frequency clock is fast or slow, and then outputs digital data corresponding to an average voltage proportional to the frequency difference of the determined result.

However, there is a problem that the phase-frequency detector needs the reference frequency clock and an analog-to-digital converter for converting an analog voltage corresponding to an average of digital stream into a digital signal.

SUMMARY OF THE INVENTION

It is, therefore, a primary object of the present invention to provide a circuit which can determine the most suitable operating state with respect to an input frequency by automatically converting the input frequency into the digital signal.

In accordance with the present invention, there is provided a frequency-digital signal conversion circuit, comprising: a frequency detecting means for detecting a frequency of an input clock signal; a latch means for sampling and latching an output of the frequency detecting means; and a digital signal generating means for receiving an output of the latch means and generating a digital signal of a predetermined bits with respect to the frequency of the input clock signal.

The frequency detecting means includes: a first detecting unit for detecting a high level period of the input clock signal; and a second detecting unit for detecting a low level period of the input clock signal. The first detecting unit includes: a plurality of first resistors connected in series between a first PMOS transistor and a first NMOS transistor; and a plurality of first transistors respectively connected in parallel with the first resistors. The second detecting unit includes: a plurality of second resistors connected in series between a second PMOS transistor and a second NMOS transistor; and a plurality of second transistors respectively connected in parallel with the second resistors, in which the output signal and inverted output signal of the digital signal generating means are applied to gates of the first and second transistors, respectively.

The frequency-digital signal conversion circuit further comprises an erroneous operation preventing means, wherein the erroneous operation preventing means performs a hysteresis operation in order to prevent the output signal of the latch means from oscillating at a logic threshold voltage, in case the frequency detecting operation is completed while the frequency of the clock signal is converted into the digital signal so that the output signal of the latch means is changed from one level to another level. The erroneous operation preventing means includes: resistors connected between first and second PMOS transistors and a plurality of first and second resistors; and an NMOS transistor and a PMOS transistor connected in parallel with the resistors, the output signal of the latch means being applied to gates of the NMOS and PMOS transistors.

The latch means includes: a first latch unit for sampling and latching an output of the first detecting unit; a second latch unit for sampling and latching an output of the second detecting unit; and an output unit for logically combining the outputs of the first and second latch units to generate the output signal. Each of the first and second latch units includes: a buffer unit for buffering the outputs of the first and second detecting units in order for a data hold time; a first transmission unit for transmitting an output of the buffer unit in synchronization with a falling edge of the clock signal; a first latch for latching an output of the first transmission unit; a second transmission unit for transmitting an output of the first latch in synchronization with a rising edge of a next clock signal; and a second latch for latching an output of the second transmission unit.

The output unit is provided with a logic gate for NORing the outputs of the first and second latch units. The digital signal generating means is a shift register provided with a plurality of D flip-flops for receiving and shifting the output signals of the latch means according to the clock signal to generate the digital signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, the preferred embodiments of the present invention will be described in detail with reference to the accompanying drawings.

Figure 1:
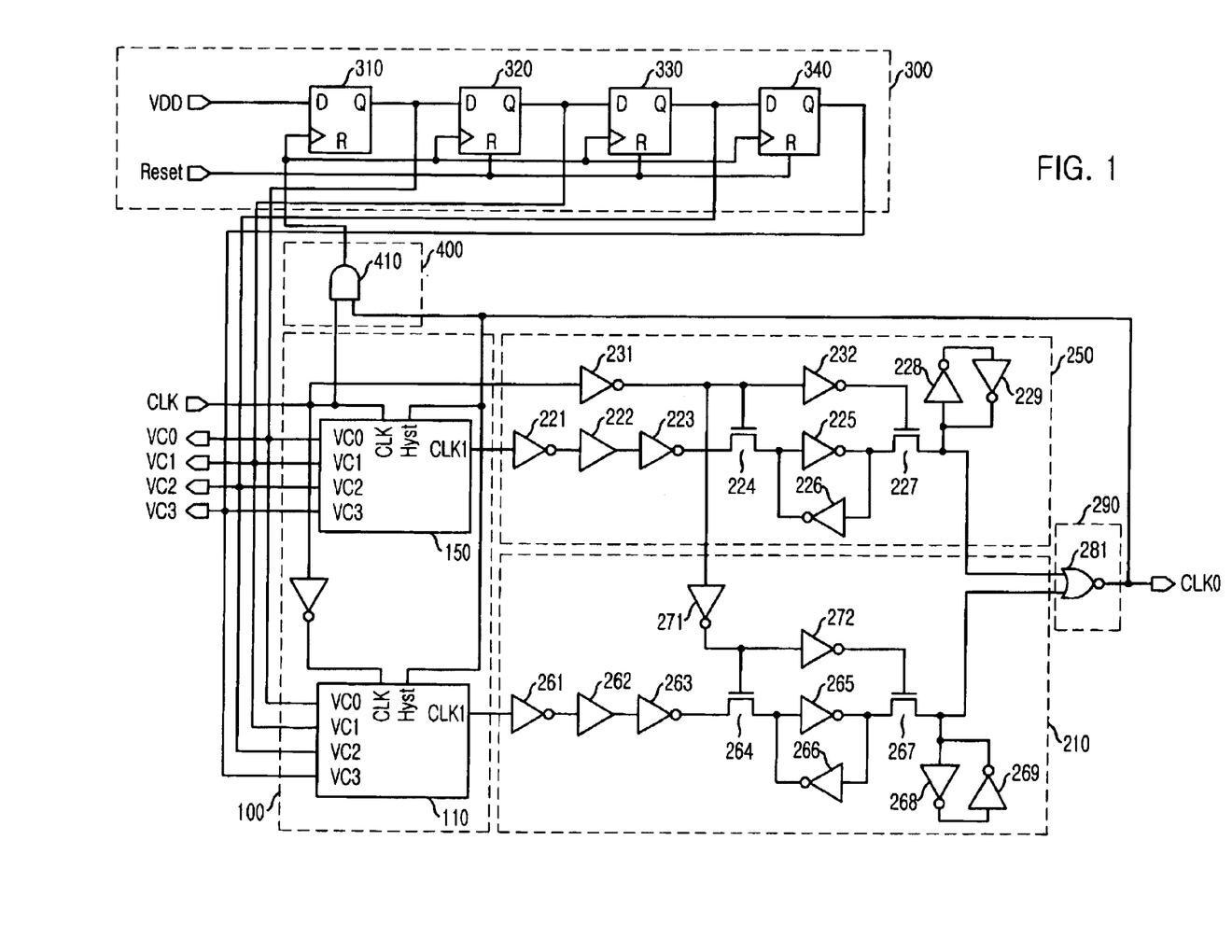
FIG. 1 is a circuit diagram of a frequency-digital signal conversion circuit in accordance with the present invention.
Figure 2:
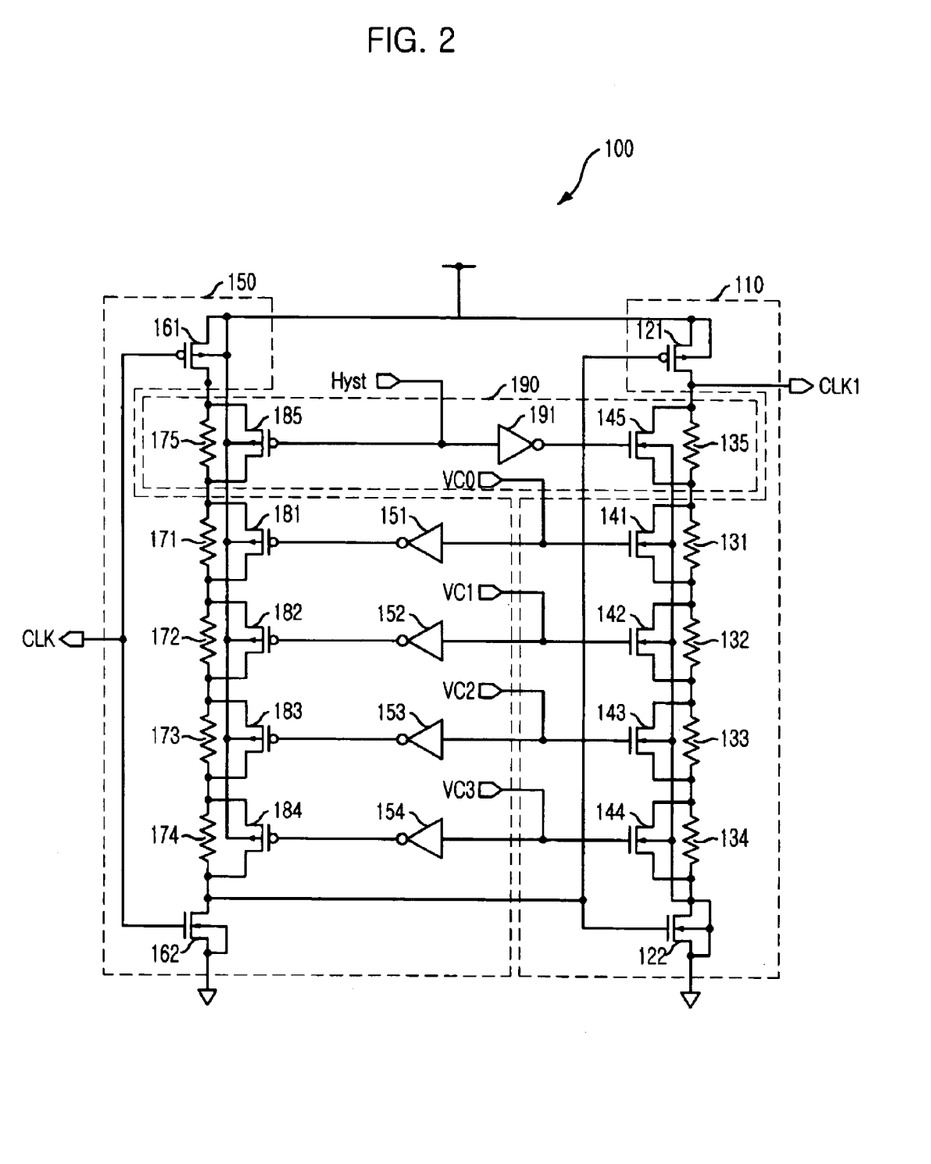
FIG. 2 is a detailed circuit diagram illustrating a frequency detecting unit of a frequency-digital signal conversion circuit shown in FIG. 1.

FIG. 1 is a circuit diagram of a frequency-digital signal conversion circuit in accordance with an embodiment of the present invention, and FIG. 2 is a detailed circuit diagram of a frequency detecting unit of the frequency-digital signal conversion unit shown in FIG. 1.

Referring to FIGS. 1 and 2, the frequency-digital signal conversion circuit in accordance with an embodiment of the present invention includes a frequency detecting unit 100 for detecting a frequency of an input clock signal CLK, a latch unit 200 for sampling and latching an output of the frequency detecting unit 100, and a digital signal generating unit 300 for receiving an output of the latch unit 200 and generating a predetermined bit (e.g., 4-bit) digital signal in response to the input clock signal CLK.

The frequency detecting unit 100 is provided with a first detecting unit 110 and a second detecting unit 150. The first and second detecting units 110 and 150 detect a high level period and a low level period of the input clock signal CLK, respectively. The first detecting unit 110 includes: resistors 131 to 134 connected in series between a PMOS transistor 121 and an NMOS transistor 122; and NMOS transistors 141 to 144 connected in parallel with the resistors 131 to 134, respectively. The second detecting unit 150 includes: resistors 171 to 174 connected in series between a PMOS transistor 161 and an NMOS transistor 162; and PMOS transistors 181 to 184 connected in parallel with the resistors 171 to 174, respectively.

At this time, the clock signal CLK is applied to the gates of the PMOS and NMOS transistors 161 and 162 of the second detecting unit 150. Digital signals VC0 to VC3 outputted from the digital signal generating unit 300 are respectively inputted to the inverters 151 to 154 and the outputs of the inverters 151 to 154 are applied to the gates of the PMOS transistors 181 to 184 connected in parallel with the resistors 171 to 174. Meanwhile, the PMOS transistor 121 and the NMOS transistor 122 of the first detecting unit 110 have gates connected to a drain of the NMOS transistor 162 so that an inverted clock signal CLK1 is applied thereto. The digital signals VC0 to VC3 outputted from the digital signal generating unit 300 are applied to the gates of the NMOS transistors 141 to 144 connected in parallel with the resistors 131 to 134, respectively.

The latch unit 200 includes: a first latch unit 210 for sampling and latching the output of the first detecting unit 110; a second latch unit 250 for sampling and latching the output of the second detecting unit 150; an output unit 290 configured with a logic gate 281 for combining the outputs of the first and second latch units 210 and 250 to generate an output signal CLK0.

The first latch unit 210 includes: a buffer unit configured with inverters 261 and 263 and a buffer 262, for buffering the output of the first detecting unit 110 in order for a data hold time tHD; a first transmission unit configured with an NMOS transistor 264, for transmitting an output of the buffer unit in synchronization with a falling edge of the clock signal CLK; a first latch configured with inverters 265 and 266, for latching an output of the first transmission unit; a second transmission unit configured with an NMOS transistor 267, for transmission an output of the first latch in synchronization with a rising edge of a next clock signal; and a second latch configured with inverters 268 and 269, for latching an output of the second transmission unit.

The second latch unit 250 includes: a buffer unit configured with inverters 221 and 223 and a buffer 222, for delaying the output of the second detecting unit 150 in order for a data hold time tHD; a first transmission unit configured with an NMOS transistor 224, for transmitting an output of the buffer unit in synchronization with a falling edge of the clock signal CLK; a first latch configured with inverters 225 and 226, for latching an output of the first transmission unit; a second transmission unit configured with an NMOS transistor 227, for transmitting an output of the first latch in synchronization with a rising edge of a next clock signal; and a second latch configured with inverters 228 and 229, for latching an output of the second transmission unit.

The digital signal generating unit 300 is provided with a shift register. The shift register includes D flip-flops 310 to 340 for receiving and shifting the output signal CLK0 of the latch unit 200 according to the clock signal CLK to generate the digital signals VC0 to VC3.

Additionally, the frequency detecting unit 100 further includes an erroneous operation preventing unit 190. The erroneous operation preventing unit 190 performs a hysteresis operation in order to prevent the output signal CLK0 from oscillating at a logic threshold voltage when the frequency detecting operation is completed during a conversion of the clock signal CLK into the digital signal so that the output signal CLK0 of the latch circuit 200 becomes a low level.

The erroneous operation preventing unit 190 includes a first preventing unit 191 for preventing an erroneous operation at the high level period of the input clock signal CLK, and a second preventing unit 192 for preventing an erroneous operation at the low level period of the input clock signal CLK. The first preventing unit 191 is provided with a resistor 135 connected between the PMOS transistor 121 and the resistor 131, and an NMOS transistor 145 connected in parallel with the resistor 135. The second preventing unit 192 is provided with a resistor 175 connected between the PMOS transistor 161 and the resistor 171, and a PMOS transistor 185 connected in parallel with the resistor 185.

An operation of the frequency-digital signal conversion circuit in accordance with the present invention will be described below with reference to FIGS. 3 to 6.

After a power-up, all the output signals VC0 to VC3 of the digital signal generating unit 300 are reset to a low level. Therefore, a detecting frequency (fset) is set to a predetermined frequency (for example, 50 MHz) and a detecting pulse width (Tset) is set to (½fset-tDH). Here, "tDH" is a delay time of the buffer unit, which is provided with the inverters and buffer 221 to 223, or 261 to 263.

Figure 3:
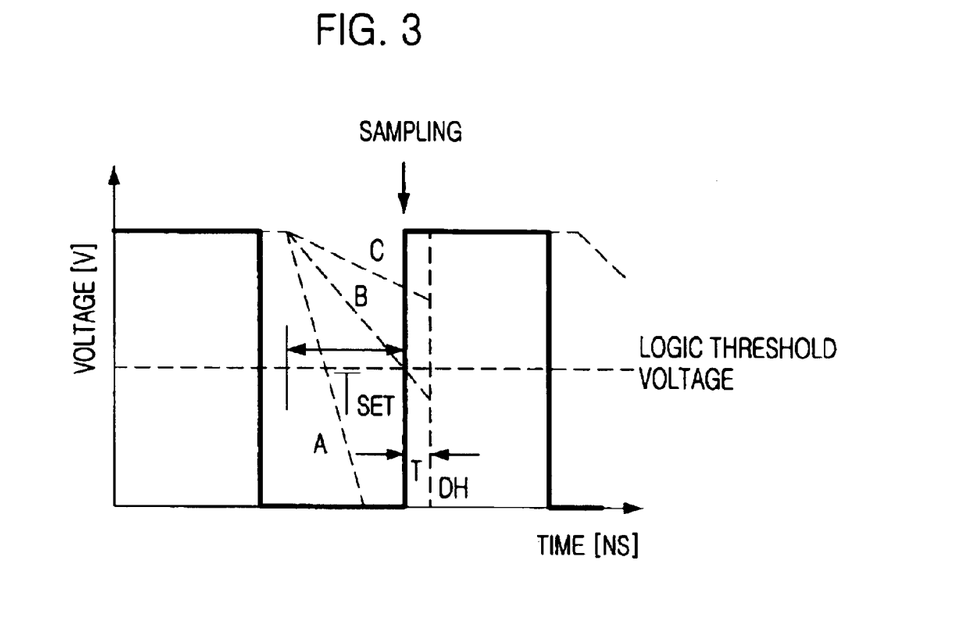
FIG. 3 illustrates an operation principle of a frequency detecting unit of a frequency-digital signal conversion circuit shown in FIG. 1.

As described in FIG. 3, the falling time of the input clock signal CLK becomes slow and the rising time becomes relatively fast due to the pull-up transistor 161 and the pull-down transistor 122. If the low level period of the input clock signal CLK is shorter than the set frequency fset, the second detecting unit 150 of the frequency detecting unit 100 detects the high level at the rising edge of the next clock signal, which is denoted by a reference symbol "c" in FIG. 3.

At this time, if the first detecting unit 110 also detects the high level, the outputs of the first and second latch units 210 and 250 become the low levels, so that an output of a NOR gate 281 of the output unit 290 is set to the high level.

Accordingly, the outputs VC0 to VC3 of the D flip-flops 310 to 340 become "1000" since the output signals CLK0 of the high level are applied to clock terminals of the D flip-flops 310 to 340, which are contained in the shift register of the digital signal generating unit 300, in synchronization with the clock signal CLK.

Since the NMOS transistor 141 and 181 connected in parallel with the resistors 131 and 171 are turned on in response to the output signal VC0 of the high level, the resistors 131 and 171 are bypassed. Accordingly, the detecting frequency fset is set to 100 MHz.

By repeating the above-described operations, the first and second detecting units 110 and 150 of the frequency detecting unit 100 detect the high level period and the low level period at the rising edge of the next clock signal, respectively. If the signal CLK0 of the high level is generated at the second time from the latch unit 200, the outputs of the D flip-flops 310 to 340 becomes "1100". Therefore, the transistors 141, 142, 181 and 182 are turned on to bypass the resistors 131, 132, 171 and 172. If the signal of the high level is generated at the third time, the outputs of the D flip-flops 310 to 340 become "1110". Therefore, the transistors 141 to 143 and 181 to 183 are turned on to bypass the resistors 131 to 133 and 171 to 173. Next, the outputs of the D flip-flops 310 to 340 become "1111", so that all the transistors 141 to 144 and 181 to 184 are turned on to bypass all the resistors 131 to 134 and 171 to 174.

Through the above-described operation, the first and second detecting units 110 and 150 become a level and the above operations are repeated until the output signal CLK0 of the latch circuit 200 becomes a low level.

The frequency is converted into the digital signals VC0 to VC3 by repeating the frequency detecting operation until the output signal CLK0 of the latch circuit 200 becomes a low level to thereby generate the digital signals VC0 to VC3. A following Table 1 shows the digital signals VC0 to VC3 that are outputted according to the input clock signal CLK.

TABLE 1

|                    | VC0  | VC1  | VC2  | VC3  |
|--------------------|------|------|------|------|
| 50 MHz or less     | LOW  | LOW  | LOW  | LOW  |
| 50 MHz to 100 MHz  | HIGH | LOW  | LOW  | LOW  |
| 100 MHz to 150 MHz | HIGH | HIGH | LOW  | LOW  |
| 150 MHz to 200 MHz | HIGH | HIGH | HIGH | LOW  |
| 200 MHz or more    | HIGH | HIGH | HIGH | HIGH |

Referring to Table 1, in case the input clock signal CLK is 50 MHz or less, the digital signals VC0 to VC3 generated from the digital generating unit 300 are "0000". In case the input clock signal CLK is in a range between 50 MHz and 100 MHz, the digital signals VC0 to VC3 are "1000". In case the input clock signal CLK is in a range between 100 MHz and 150 MHz, the digital signals VC0 to VC3 are "1100". In case the input clock signal CLK is in a range between 150 MHz and 200 MHz, the digital signals VC0 to VC3 are "1110". In case the input clock signal CLK is 200 MHz or less, the digital signals VC0 to VC3 are "1111".

Figure 4:
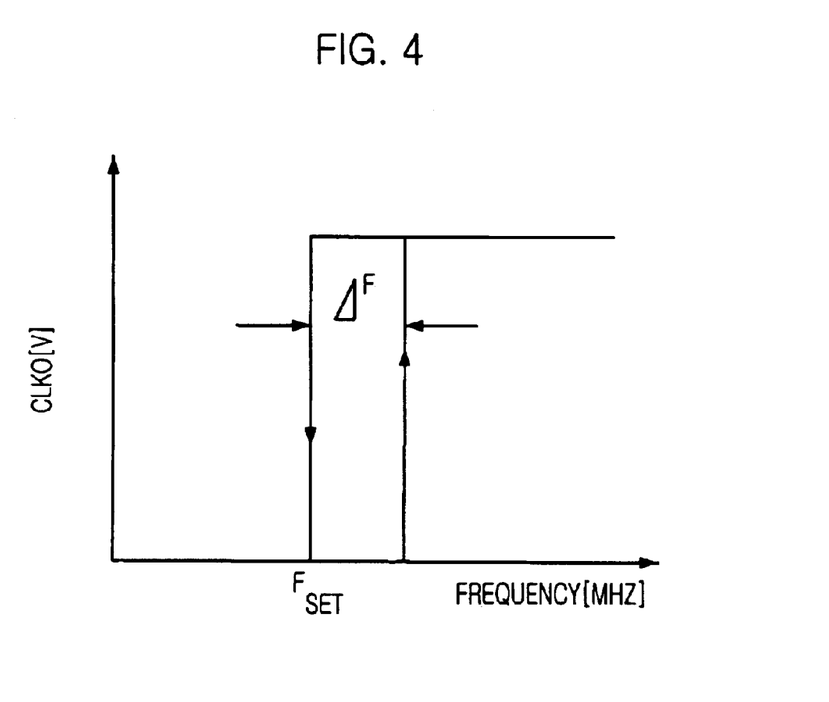
FIG. 4 illustrates a hysteresis characteristic of a frequency detecting unit of a frequency-digital signal conversion circuit shown in FIG. 1.

When the frequency detecting operation is completed and the output CLK0 of the latch unit 200 becomes a low level, the output CLK0 of the latch unit 200 is provided as a hysteresis signal Hyst. The transistors 145 and 185 are turned on in response to the hysteresis signal Hyst, so that the resistors 135 and 175 are bypassed. As shown in FIG. 4, the set frequency fset is then lowered by Δf, so that the hysteresis operation is performed. Consequently, according to the detecting operation of the frequency detecting unit 100, when the output CLK0 of the latch circuit 200 becomes a low level, an erroneous operation does not occur since an oscillation is prevented from occurring at the logic threshold voltage.

Figure 5A:
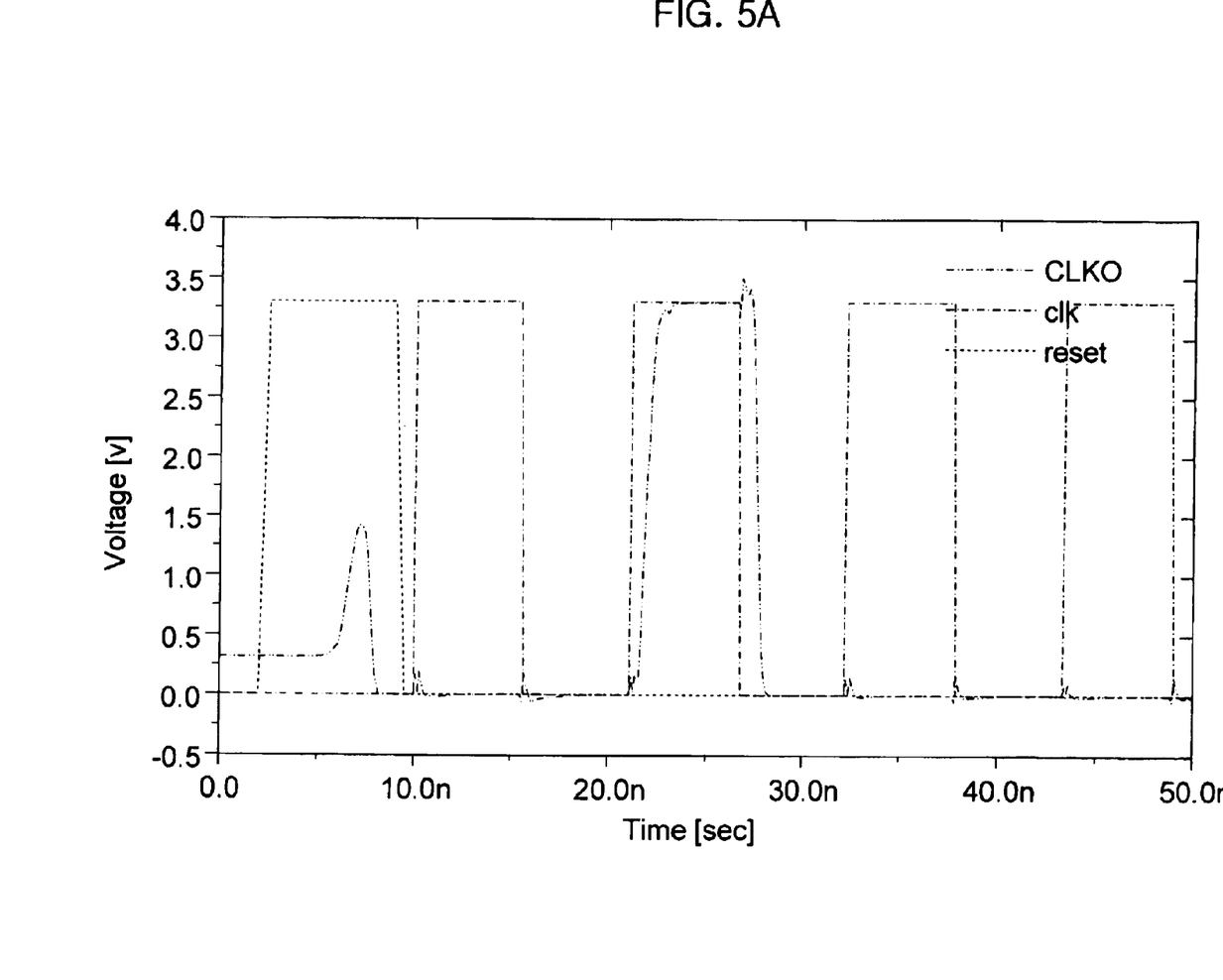
FIGS. 5A and 5B are simulation results illustrating an input frequency and an output characteristic of a corresponding digital signal, in case the input frequency is 90 MHz.
Figure 5B:
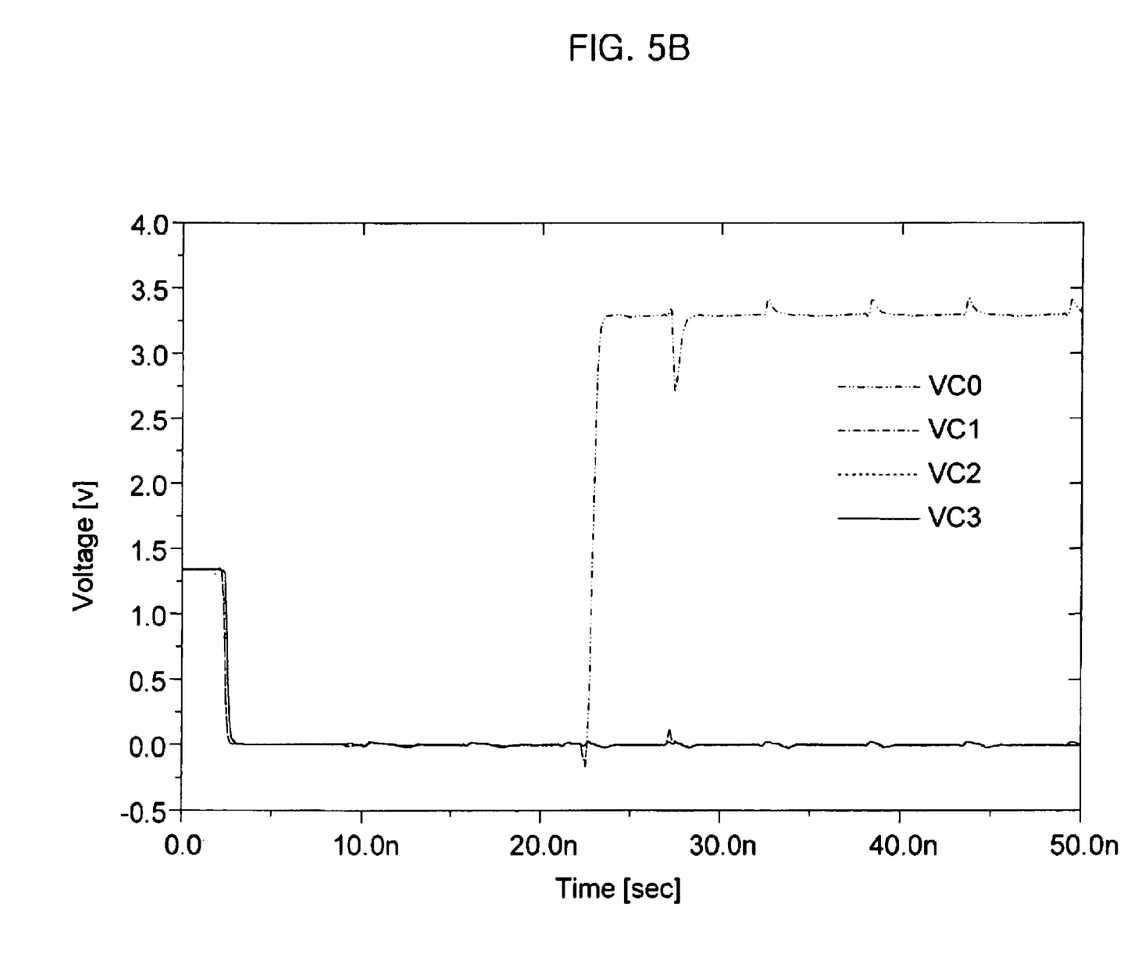
Figure 6A:
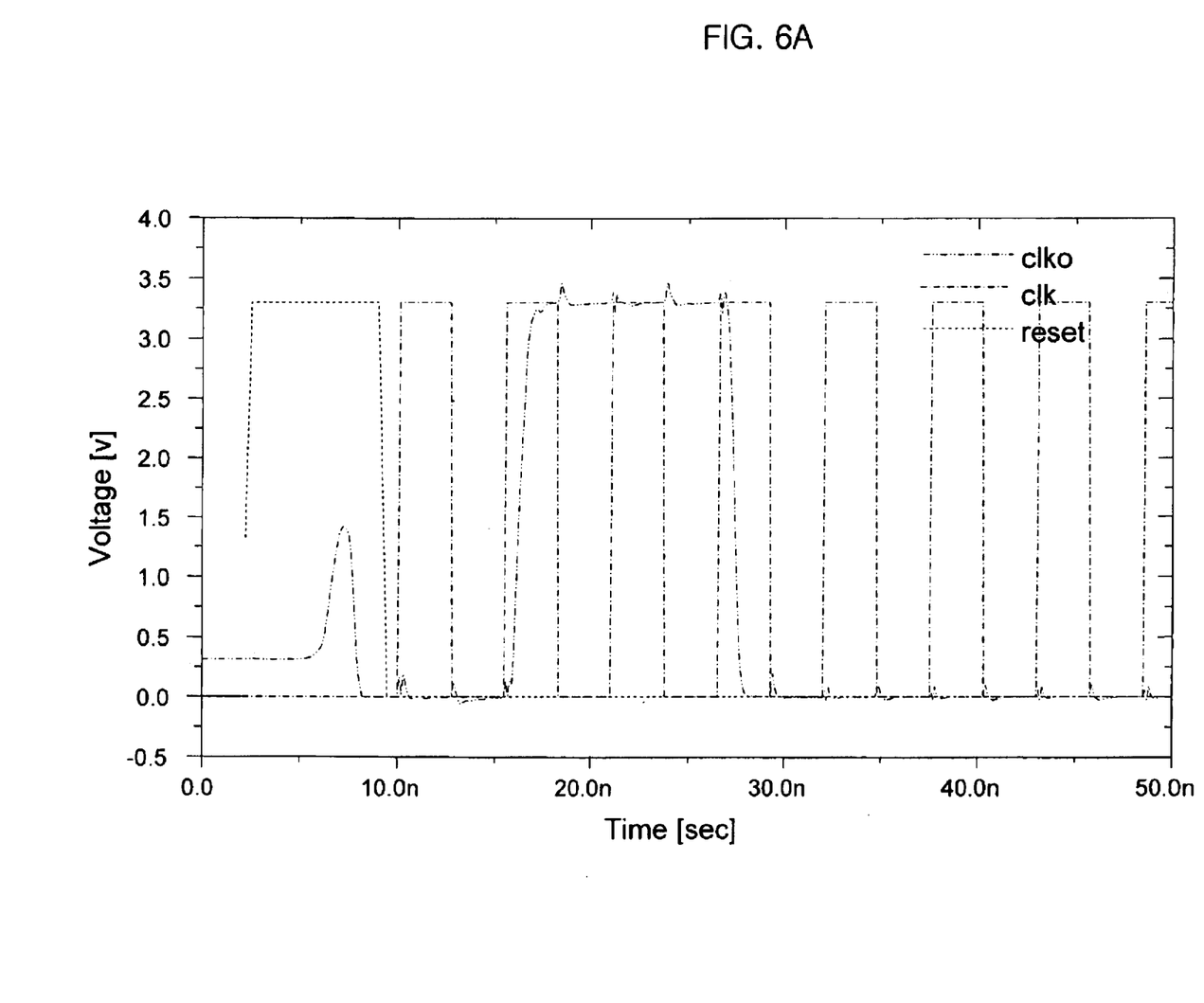
FIGS. 6A and 6B are simulation results illustrating an input frequency and an output characteristic of a corresponding digital signal, in case the input frequency is 180 MHz.
Figure 6B:
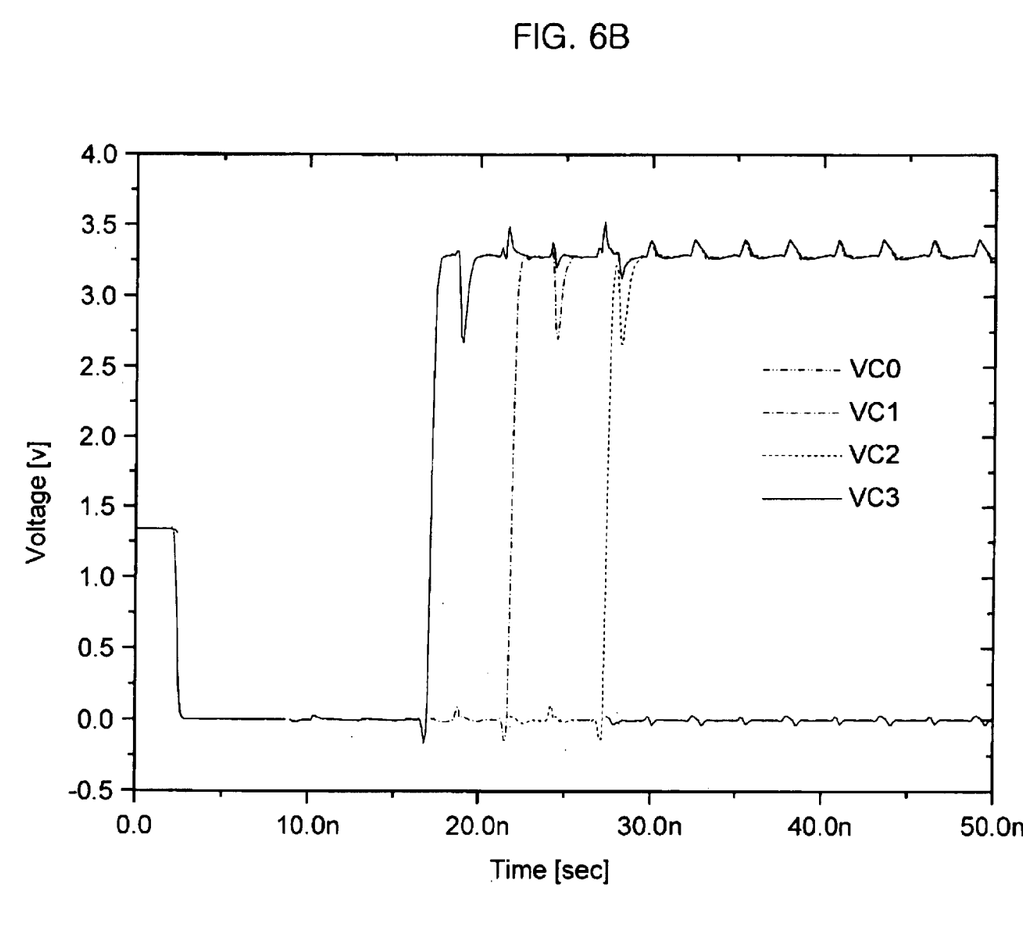

FIG. 5A is a waveform of the signals CLK0 and CLK and the power-up signal Reset in case the input clock signal CLK is 90 MHz, and FIG. 5B is an output waveform of the digital signals VC0 to VC3. FIG. 6A is a waveform of the signals CLK0 and CLK and the power-up signal Reset in case the input clock signal CLK is 180 MHz, and FIG. 6B is an output waveform of the digital signals VC0 to VC3.

The resistors 141 to 145 and 171 to 175 of FIG. 2 are polysilicon resistors having an excellent temperature characteristic and an excellent current-voltage linearity. The resistances are adjusted so that the outputs of the digital signals can be a linear thermo-code. The above Table 1 shows the digital signals VC0 to VC3 that are outputted after dividing the frequency operating ranges of the input clock signal CLK, and FIGS. 5B and 6B are the HSPICE simulation result of Table 1, which shows a linear operating characteristic.

According to the present invention, although the frequency of the input clock signal is outputted as 4-bit digital signal, 2-bit to 8-bit resolution is possible according to the user's request.

As described above, the frequency-digital signal conversion circuit can convert the input frequency into the digital signal by using only the resistors and the MOS transistors, so that the chip area can be reduced and the manufacturing cost can be lowered. Further, the wider operation range can be secured according to the changes of the input.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A frequency-digital signal conversion circuit, comprising:
   a frequency detecting means for detecting a frequency of an input clock signal;
   a latch means for sampling and latching an output of the frequency detecting means; and
   a digital signal generating means for receiving an output of the latch means and generating a digital signal of a predetermined bits with respect to the frequency of the input clock signal; and
   an erroneous operation preventing means for performing a hysteresis operation in order to prevent the output signal of the latch means from oscillating at a logic threshold voltage, in case that the frequency detecting operation is completed while the frequency of the clock signal is converted into the digital signal so that the output signal of the latch means is changed from one level to another level.

2. The frequency-digital signal conversion circuit as recited in claim 1, wherein the frequency detecting means includes:
   a first detecting unit for detecting a high level period of the input clock signal; and
   a second detecting unit for detecting a low level period of the input clock signal.

3. The frequency-digital signal conversion circuit as recited in claim 2, wherein the first detecting unit includes:
   a plurality of first resistors connected in series between a first PMOS transistor and a first NMOS transistor; and
   a plurality of first transistors respectively connected in parallel with the first resistors, and
   the second detecting unit includes:
   a plurality of second resistors connected in series between a second PMOS transistor and a second NMOS transistor; and
   a plurality of second transistors respectively connected in parallel with the second resistors,
   the output signal and inverted output signal of the digital signal generating means being applied to gates of the first and second transistors, respectively.

4. The frequency-digital signal conversion circuit as recited in claim 2, wherein the latch means includes:
- a first latch unit for sampling and latching an output of the first detecting unit;
- a second latch unit for sampling and latching an output of the second detecting unit; and
- an output unit for logically combining the outputs of the first and second latch units to generate the output signal.

5. The frequency-digital signal conversion circuit as recited in claim 4, wherein each of the first and second latch units includes:
- a buffer unit for buffering the outputs of the first and second detecting units in order for a data hold time;
- a first transmission unit for transmitting an output of the buffer unit in synchronization with a falling edge of the clock signal;
- a first latch for latching an output of the first transmission unit;
- a second transmission unit for transmitting an output of the first latch in synchronization with a rising edge of a next clock signal; and
- a second latch for latching an output of the second transmission unit.

6. The frequency-digital signal conversion circuit as recited in claim 4, wherein the output unit is provided with a logic gate for NORing the outputs of the first and second latch units.

7. The frequency-digital signal conversion circuit as recited in claim 1, wherein the erroneous operation preventing means includes:
- resistors connected between first and second PMOS transistors and a plurality of first and second resistors; and
- an NMOS transistor and a PMOS transistor connected in parallel with the resistors, the output signal of the latch means being applied to gates of the NMOS and PMOS transistors.

8. The frequency-digital signal conversion circuit as recited in claim 1, wherein the digital signal generating means is a shift register provided with a plurality of D flip-flops for receiving and shifting the output signals of the latch means according to the clock signal to generate the digital signal.

* * * * *